US011092671B2

(12) United States Patent
Sarkissian et al.

(10) Patent No.: US 11,092,671 B2
(45) Date of Patent: Aug. 17, 2021

(54) LASER DIODE OPTICAL FREQUENCY MODULATION LINEARIZATION ALGORITHM

(71) Applicant: GM Global Technology Operations LLC, Detroit, MI (US)

(72) Inventors: Raymond Sarkissian, Studio City, CA (US); Keyvan Sayyah, Santa Monica, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 520 days.

(21) Appl. No.: 16/020,214

(22) Filed: Jun. 27, 2018

(65) Prior Publication Data

US 2019/0018140 A1 Jan. 17, 2019

Related U.S. Application Data

(60) Provisional application No. 62/531,414, filed on Jul. 12, 2017.

(51) Int. Cl.
*G01S 17/32* (2020.01)
*G01S 17/93* (2020.01)
(Continued)

(52) U.S. Cl.
CPC .............. *G01S 7/4815* (2013.01); *B81B 7/02* (2013.01); *G01S 7/4816* (2013.01);
(Continued)

(58) Field of Classification Search
CPC ...... G01S 7/4815; G01S 7/4911; G01S 17/58; G01S 17/42; G01S 17/34; G01S 17/86;
(Continued)

(56) References Cited

U.S. PATENT DOCUMENTS 5,139,879 A 8/1992 Aharoni
5,283,846 A 2/1994 Toyonaka
(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — Daniel L Murphy
(74) *Attorney, Agent, or Firm* — Cantor Colburn LLP

(57) ABSTRACT

A lidar system includes a laser diode to provide a frequency modulated continuous wave (FMCW) signal, and a current source to provide a drive signal that modulates the laser diode. The current source is controlled to pre-distort the drive signal to provide a linear FMCW signal. The lidar system also includes a splitter to split the FMCW signal into an output signal and a local oscillator (LO) signal, a transmit coupler to transmit the output signal, a receive coupler to obtain a received signal based on reflection of the output signal by a target, and a combiner to combine the received signal with the LO signal into first and second combined signals. A first and second photodetector respectively receive the first and second combined signals and output first and second electrical signals from which a beat signal that indicates the pre-distortion needed for the drive signal is obtained.

20 Claims, 3 Drawing Sheets

(51) Int. Cl.
*G01S 7/491* (2020.01)
*G01S 7/481* (2006.01)
*G01S 7/4911* (2020.01)
*G01S 17/58* (2006.01)
*G01S 17/42* (2006.01)
*G01S 17/34* (2020.01)
*G01S 17/86* (2020.01)
*G01S 17/931* (2020.01)
*G01S 7/499* (2006.01)
*G01S 17/02* (2020.01)
*G02B 6/122* (2006.01)
*G02B 6/27* (2006.01)
*G02B 6/42* (2006.01)
*H01L 23/544* (2006.01)
*H01L 31/0232* (2014.01)
*H01L 31/16* (2006.01)
*G01S 17/00* (2020.01)
*G01S 7/4914* (2020.01)
*G01S 7/497* (2006.01)
*B81B 7/02* (2006.01)
*G02B 27/30* (2006.01)
*H01S 5/125* (2006.01)
*G01S 7/4913* (2020.01)
*G02B 6/00* (2006.01)

(52) U.S. Cl.
CPC .......... *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(58) Field of Classification Search
CPC ...... G01S 17/931; G01S 7/499; G01S 7/4817; G01S 7/4816; G01S 17/003; G01S 17/32; G01S 7/4914; G01S 7/491; G01S 7/4972; G01S 17/02; G01S 7/4818; G01S 7/4913; G02B 6/22; G02B 6/2766; G02B 6/4209; G02B 27/30; H01L 23/544; H01L 31/02327; H01L 31/16; H01L 2223/54426; H01L 2223/54486; B81B 2207/03; B81B 7/02
USPC ......................................................... 356/5.01
See application file for complete search history.

(56) References Cited

U.S. PATENT DOCUMENTS

| | | | |
|---|---|---|---|
| 5,499,132 | A | 3/1996 | Tojo |
| 6,122,110 | A | 11/2000 | Park |
| 6,229,947 | B1 | 5/2001 | Vawter |
| 6,480,331 | B1 | 11/2002 | Cao |
| 6,962,345 | B2 | 11/2005 | Inciong |
| 7,108,810 | B2 | 9/2006 | Nakamura |
| 7,359,593 | B2 | 4/2008 | Little |
| 7,481,588 | B2 | 1/2009 | Monte |
| 8,116,602 | B2 | 2/2012 | Little |
| 8,121,450 | B2 | 2/2012 | Webster |
| 9,122,037 | B2 | 9/2015 | Shastri |
| 9,310,471 | B2 | 4/2016 | Sayyah et al. |
| 9,335,480 | B1 | 5/2016 | Celo |
| 9,575,162 | B2 | 2/2017 | Owechko |
| 2001/0030807 | A1 | 10/2001 | Ikari |
| 2002/0012167 | A1 | 1/2002 | Wills |
| 2004/0070827 | A1 | 4/2004 | Li |
| 2005/0018967 | A1 | 1/2005 | Huang |
| 2005/0213979 | A1 | 9/2005 | Nakashima |
| 2006/0002443 | A1 | 1/2006 | Farber |
| 2010/0200898 | A1 | 8/2010 | Lin |
| 2012/0152918 | A1 | 6/2012 | Li |
| 2013/0209033 | A1 | 8/2013 | Luff |
| 2015/0042992 | A1 | 2/2015 | Cui |
| 2017/0153319 | A1 | 6/2017 | Villeneuve |
| 2017/0184450 | A1 | 6/2017 | Doylend |
| 2017/0336565 | A1 | 11/2017 | Ryckman |
| 2017/0370676 | A1 | 12/2017 | Volfson |
| 2018/0024299 | A1 | 1/2018 | Leijtens |

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.

Winter et al., "Micro-beamer based on MEMS micro-mirrors and laser light source", Procedia Chemistry, vol. 1, Issue 1, 2009, pp. 1311-1314.

__

LASER DIODE OPTICAL FREQUENCY MODULATION LINEARIZATION ALGORITHM

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to a laser diode optical frequency modulation linearization algorithm.

Vehicles (e.g., automobiles, trucks, construction equipment, farm equipment, automated factory equipment) are increasingly outfitted with sensors that provide information to augment or automate vehicle operation. Exemplary sensors include radio detection and ranging (radar) systems, cameras, microphones, and light detection and ranging (lidar) systems. An exemplary lidar system is a coherent lidar system that transmits a frequency modulated continuous wave (FMCW) signal and relies on optical coherence between the transmitted signal and a return signal resulting from reflected scattering of the transmitted signal by a target to perform detection of the target. In order to obtain the FMCW signal, one approach involves a combination of a laser and high quality factor (high Q) electro-optic resonator that does not require pre-distortion based optical frequency linearization. However, that approach is costly. Accordingly, it is desirable to provide a laser diode optical frequency modulation linearization algorithm.

SUMMARY

In one exemplary embodiment, a lidar system includes a laser diode to provide a frequency modulated continuous wave (FMCW) signal, and a current source to provide a drive signal that modulates the laser diode to provide the FMCW signal. The current source is controlled to perform pre-distortion of the drive signal to provide the FMCW signal as linear. The lidar system also includes a splitter to split the FMCW signal into an output signal and a local oscillator (LO) signal, a transmit coupler to transmit the output signal, a receive coupler to obtain a received signal based on reflection of the output signal by a target, and a combiner to combine the received signal with the LO signal and split a result into a first combined signal and a second combined signal. A first photodetector receives the first combined signal and outputs a first electrical signal based on interference of the received signal and the LO signal in the first combined signal. A second photodetector receives the second combined signal and outputs a second electrical signal based on interference of the received signal and the LO signal in the second combined signal. A beat signal obtained from the first electrical signal and the second electrical signal indicates the pre-distortion needed for the drive signal.

In addition to one or more of the features described herein, the pre-distortion of the drive signal results from determination of a modulation voltage $V_{app}$ of the drive signal.

In addition to one or more of the features described herein, the modulation voltage $V_{app}$ is determined based on using the beat signal for feedback control.

In addition to one or more of the features described herein, the modulation voltage $V_{app}$ that results in a constant frequency of the beat signal is determined to obtain the pre-distortion of the drive signal.

In addition to one or more of the features described herein, the laser diode is a photon-emitting semiconductor device fabricated on or attached on top of a photonic chip.

In addition to one or more of the features described herein, the lidar system also includes a transmit lens and a transmit beam steering device. The transmit beam steering device directs the output signal out of the lidar system after collimation of the output signal from the transmit coupler by the transmit lens.

In addition to one or more of the features described herein, the lidar system also includes a receive lens and a receive beam steering device. The receive lens focuses the received signal directed by the receive beam steering device to the receive coupler.

In addition to one or more of the features described herein, the lidar system is in a vehicle.

In addition to one or more of the features described herein, information obtained from the beat signal is used by a vehicle controller to augment or automate operation of the vehicle.

In another exemplary embodiment, a method of configuring a lidar system includes fabricating or attaching a laser diode on a photonic chip to provide a frequency modulated continuous wave (FMCW) signal, and arranging a current source to provide a drive signal to the laser diode. A pre-distortion of the drive signal is determined to modulate the laser diode to provide the FMCW signal as linear. The method also includes disposing a splitter to split the FMCW signal into an output signal and a local oscillator (LO) signal, arranging a transmit coupler to transmit the output signal, arranging a receive coupler to obtain a received signal based on reflection of the output signal by a target, and assembling a combiner to combine the received signal with the LO signal and split a result into a first combined signal and a second combined signal. A first photodetector receives the first combined signal and outputs a first electrical signal based on interference of the received signal and the LO signal in the first combined signal. A second photodetector receives the second combined signal and outputs a second electrical signal based on interference of the received signal and the LO signal in the second combined signal. A beat signal obtained from the first electrical signal and the second electrical signal is used in the determining the pre-distortion of the drive signal.

In addition to one or more of the features described herein, the determining the pre-distortion of the drive signal includes determining a modulation voltage $V_{app}$ of the drive signal.

In addition to one or more of the features described herein, the determining the modulation voltage $V_{app}$ of the drive signal includes using the beat signal for feedback control, and the determining the modulation voltage $V_{app}$ of the drive signal includes determining the modulation voltage $V_{app}$ that results in a constant frequency of the beat signal.

In addition to one or more of the features described herein, the method also includes arranging a transmit beam steering device to direct the output signal out of the lidar system after collimation of the output signal from the transmit coupler by a transmit lens.

In addition to one or more of the features described herein, the method also includes arranging a receive lens to focus the received signal directed by a receive beam steering device to the receive coupler.

In yet another exemplary embodiment, a vehicle includes a lidar system that includes a laser diode to provide a frequency modulated continuous wave (FMCW) signal, and a current source to provide a drive signal that modulates the laser diode to provide the FMCW signal. The current source is controlled to perform pre-distortion of the drive signal to provide the FMCW signal as linear. The lidar system of the vehicle also includes a splitter to split the FMCW signal into an output signal and a local oscillator (LO) signal, a transmit coupler to transmit the output signal, a receive coupler to obtain a received signal based on reflection of the output signal by a target, and a combiner to combine the received signal with the LO signal and split a result into a first combined signal and a second combined signal. A first photodetector receives the first combined signal and outputs a first electrical signal based on interference of the received signal and the LO signal in the first combined signal. A second photodetector receives the second combined signal and outputs a second electrical signal based on interference of the received signal and the LO signal in the second combined signal. A beat signal obtained from the first electrical signal and the second electrical signal indicates the pre-distortion needed for the drive signal. The vehicle also includes a vehicle controller to augment or automate operation of the vehicle based on information obtained from the beat signal.

In addition to one or more of the features described herein, the pre-distortion of the drive signal results from determination of a modulation voltage $V_{app}$ of the drive signal.

In addition to one or more of the features described herein, the modulation voltage $V_{app}$ is determined based on using the beat signal for feedback control.

In addition to one or more of the features described herein, the modulation voltage $V_{app}$ that results in a constant frequency of the beat signal is determined to obtain the pre-distortion of the drive signal.

In addition to one or more of the features described herein, the laser diode is a photon-emitting semiconductor device fabricated on or attached on top of a photonic chip.

In addition to one or more of the features described herein, the vehicle also includes a transmit lens, a transmit beam steering device, a receive lens, and a receive beam steering device. The transmit beam steering device directs the output signal out of the lidar system after collimation of the output signal from the transmit coupler by the transmit lens, and the receive lens focuses the received signal directed by the receive beam steering device to the receive coupler.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
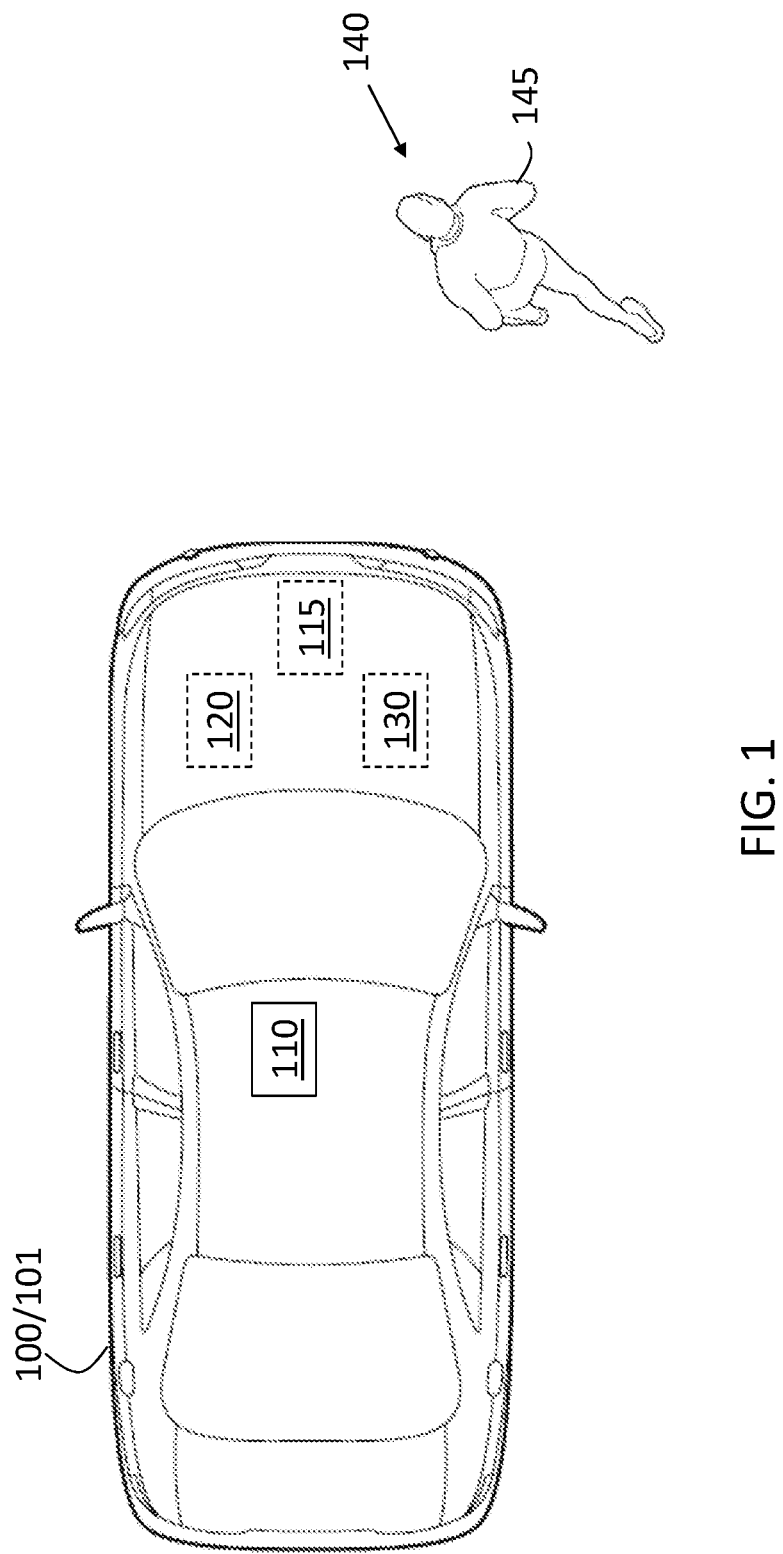
FIG. 1 is a block diagram of a scenario involving a chip-scale coherent lidar system according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a coherent lidar system transmits an FMCW signal. In a chip-scale lidar system, the FMCW signal may be obtained by controlling the drive current applied to a laser diode. However, the modulation of the drive current does not correspond exactly with the resulting frequency modulation of the continuous wave output by the laser diode. That is, a linear variation in the drive current results in a nonlinear optical frequency modulation of the signal output by the laser diode. This nonlinearity in the FMCW signal results in a reduced signal-to-noise ratio (SNR) and, consequently, a loss in performance of the lidar system.

Embodiments of the systems and methods detailed herein relate to manipulating the drive current, in a process referred to as pre-distorting, in order to obtain a linear FMCW signal and thereby increase SNR. Specifically, the drive current is parameterized and represented as a linear sum of closed form functions or a function that can be solved numerically. The amplitude of the parameterized drive current is manipulated to achieve optical frequency linearization in the laser diode. The beat signal, which is the signal obtained by processing (i.e., optical mixing) of the reflection received by the lidar system and a local oscillator (LO) light, serves as a feedback control for adjustment of the drive current waveform.

Figure 2:
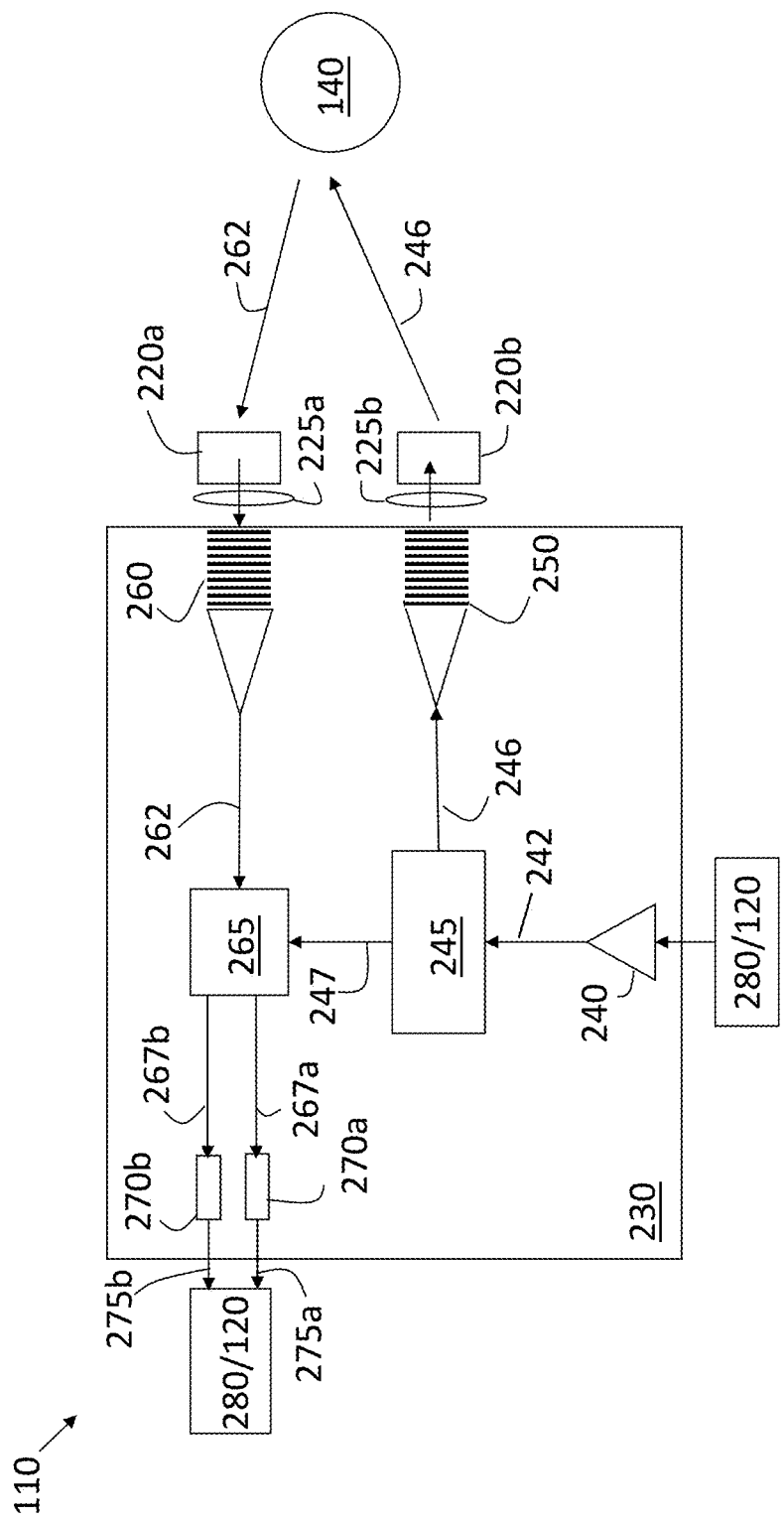
FIG. 2 is a block diagram of an exemplary lidar system according to one or more embodiments.

In accordance with an exemplary embodiment, FIG. 1 is a block diagram of a scenario involving a chip-scale coherent lidar system 110. The vehicle 100 shown in FIG. 1 is an automobile 101. A coherent lidar system 110, further detailed with reference to FIG. 2, is shown on the roof of the automobile 101. According to alternate or additional embodiments, one or more lidar systems 110 may be located elsewhere on the vehicle 100 (e.g., front and rear bumpers, sides). Another sensor 115 (e.g., camera, sonar, radar system) is shown, as well. Information obtained by the lidar system 110 and one or more other sensors 115 may be provided to a controller 120 (e.g., electronic control unit (ECU)) for image or data processing, target recognition, and subsequent vehicle control.

The controller 120 may use the information to control one or more vehicle systems 130. In an exemplary embodiment, the vehicle 100 may be an autonomous vehicle and the controller 120 may perform known vehicle operational control using information from the lidar system 110 and other sources. In alternate embodiments, the controller 120 may augment vehicle operation using information from the lidar system 110 and other sources as part of a known system (e.g., collision avoidance system, adaptive cruise control system). The lidar system 110 and one or more other sensors 115 may be used to detect objects 140, such as the pedestrian 145 shown in FIG. 1. The controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 2 is a block diagram of an exemplary lidar system 110 according to one or more embodiments. For explanatory purposes, FIG. 2 depicts a bistatic lidar system 110, which includes separate transmit and receive paths. However, the embodiments of the modulation to produce the FMCW signal 242 that are detailed herein are also applicable to a monostatic system. A photonic chip 230 includes a light source 240. The light source 240 may include components that are not on the photonic chip 230. For example, as detailed with reference to FIG. 3, the light source 240 may include a laser diode 310 on the photonic chip 230 and an off-chip current source 320. Modulation of the current source 320 results in a frequency modulated continuous wave (FMCW) signal 242 being output by the light source 240. The FMCW signal 242 is split, by a splitter 245, into the output signal 246 that is provided to transmit beam coupler 250 (e.g., grating coupler or edge coupler) for transmission and into the local oscillator (LO) signal 247.

The output signal 246 may be directed by transmit beam steering device 220b following collimation by the transmit lens 225b. The transmit beam steering device 220b may be a two-dimensional microelectromechanical system (2D MEMS) mirror, for example. The transmitted output signal 246 may encounter a target 140. In that case, some of the light reflected by the target 140 is received by a receive beam coupler 260 (e.g., grating coupler or edge coupler) as a received signal 262 after being directed by the receive beam steering device 220a (e.g., receive beam 2D MEMS mirror) and focused by the receive lens 225a.

The received signal 262 is combined with the LO signal 247 at the combiner 265 and then split into combined signal 267a and 267b (generally referred to as 267). Each combined signal 267 is provided to a photodetector 270a, 270b (generally referred to as 270). The received signal 262 and the LO signal 247 in each combined signal 267 interfere with each other in each photodetector 270. The photodetectors 270 convert the result of the interference into electrical currents 275a, 275b (generally referred to as 275) that are also referred to as beat signals with beat frequency $v_b$. The two photodetectors 270 are used in accordance with a known balanced detector technique to cancel intensity noise in the LO signal 247 (which is caused by the light source 240 and, thus, is the same in the output signal 246) that is common to both photodetectors 270. The electrical currents 275 from each of the photodetectors 270 are combined and processed to obtain three-dimensional information like range to the target 140 and the relative speed of the target 140 to the lidar system 110 as a function of two-dimensional spatial coordinates provided by the beam steering devices 220a, 220b. The processing may be performed within the lidar system 110 by a processor 280 or outside the lidar system 110 by the controller 120, for example. The processor 280 may include processing circuitry similar to that discussed for the controller 120.

Figure 3:
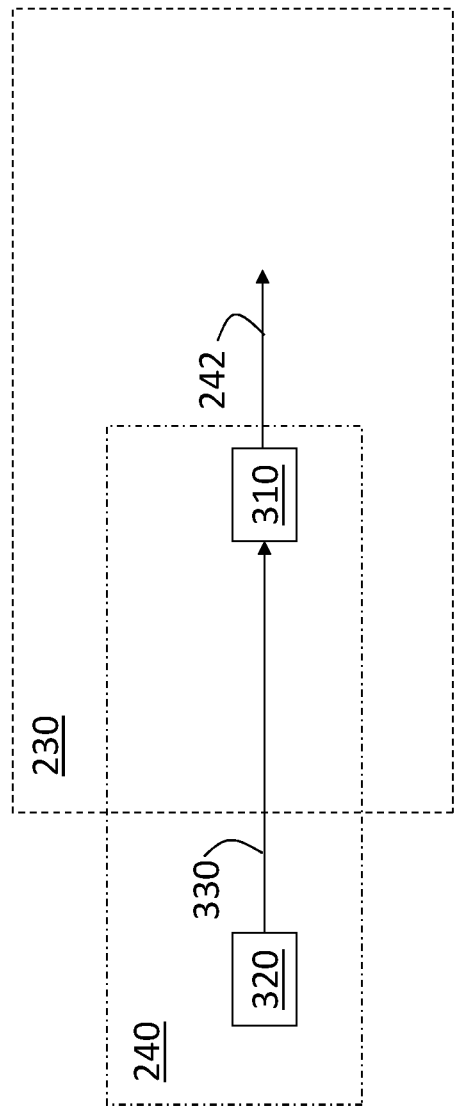
FIG. 3 is a block diagram detailing the light source of the lidar system according to one or more embodiments.

FIG. 3 is a block diagram detailing the light source 240 according to one or more embodiments. The laser diode 310 is a photon-emitting semiconductor device fabricated on or attached on top of the photonic chip 230. A programmable current source 320, which may not be part of the photonic chip 230 according to the exemplary embodiment shown in FIG. 3, is used to generate the FMCW signal 242. Modulation of the current source 320 results in a frequency modulated continuous wave (FMCW) signal 242. Specifically, the modulation voltage $V_{app}$ of the drive signal 330 over time t determines the linearity of the FMCW signal 242. As previously noted, appropriate pre-distortion (i.e., non-linearity) of the drive signal 330 results in the linearity of the FMCW signal 242. As also noted, the beat frequency $v_b$ is used as a feedback control for adjustment of the drive signal 330.

Specifically, the FMCW signal 242 may be empirically determined as a function of modulation amplitude when modulation frequency is kept constant. The beat frequency $v_b$ may be expressed as:

$$\frac{dv_b}{dt} = C\gamma_v + D_0 \qquad [\text{EQ. 1}]$$

In EQ. 1, C and $D_0$ are constants with respective units of hertz/Volts (Hz/V) and Hz/seconds (Hz/sec), respectively, and $\gamma_v$ is the slope of the time dependent modulation voltage ($V_{app}$) in units of (V/sec). EQ. 1 may be rewritten as:

$$\frac{dv_b}{dt} = C\frac{dV_{app}}{dt} + D_0 \qquad [\text{EQ. 2}]$$

EQ. 2 is used to determine the modulation voltage $V_{app}$ that would provide a constant beat frequency $v_b$, according to one or more embodiments.

Assuming that the FMCW signal 242 is not linear within the modulation time, an arbitrary function may be assigned to the beat frequency $v_b$. For example, the beat frequency $v_b$ may be written to the first order as:

$$v_b = \gamma_b t + v_{b0} \qquad [\text{EQ. 3}]$$

EQ. 3 also conforms to experimental results. Thus, EQ. 2 and EQ. 3 may be used to set the following:

$$\frac{dv_b}{dt} = C\frac{dV_{app}}{dt} + D_0 = \frac{v_{b\dot{0}0}}{t} \qquad [\text{EQ. 4}]$$

When the beat frequency $v_b$ is constant for the modulation period, as desired for a linear FMCW signal 242, applied voltage $V_{app}$ may be solved as:

$$V_{app} = \frac{1}{C}\left(v_{b\dot{0}0}\ln\left(\frac{t}{t_0}\right) - D_0 t\right) + V_{off} \qquad [\text{EQ. 5}]$$

In EQ. 5, $t_0$, $V_{off}$, and $v_{b\dot{0}0}$ are optimization parameters. In alternate embodiments, the beat frequency may be expressed in other functional forms such that the differential equation (EQ. 4) may be solved numerically.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A lidar system, comprising:
   a laser diode configured to provide a frequency modulated continuous wave (FMCW) signal;

a current source configured to provide a drive signal that modulates the laser diode to provide the FMCW signal;

a controller configured to control the current source to perform pre-distortion of the drive signal;

a splitter configured to split the FMCW signal into an output signal and a local oscillator (LO) signal;

a transmit coupler configured to transmit the output signal;

a receive coupler configured to obtain a received signal based on reflection of the output signal by a target;

a combiner configured to combine the received signal with the LO signal and split a result into a first combined signal and a second combined signal, wherein the result is based on interference between received signal and the LO signal and indicates a beat frequency;

a first photodetector configured to receive the first combined signal and output a first electrical signal based on interference of the received signal and the LO signal indicated in the first combined signal; and a second photodetector configured to receive the second combined signal and output a second electrical signal based on the interference of the received signal and the LO signal indicated in the second combined signal, wherein the controller obtains a beat signal indicating the beat frequency from the first electrical signal and the second electrical signal and, based on the beat signal, controls the pre-distortion of the drive signal from the current source to obtain the FMCW signal as linear.

2. The lidar system according to claim 1, wherein the pre-distortion of the drive signal results from determination of a modulation voltage $V_{app}$ of the drive signal.

3. The lidar system according to claim 2, wherein the modulation voltage $V_{app}$ is determined based on using the beat signal for feedback control.

4. The lidar system according to claim 3, wherein the modulation voltage $V_{app}$ that results in a constant frequency of the beat signal is determined to obtain the pre-distortion of the drive signal.

5. The lidar system according to claim 1, wherein the laser diode is a photon-emitting semiconductor device fabricated on or attached on top of a photonic chip.

6. The lidar system according to claim 1, further comprising a transmit lens and a transmit beam steering device, wherein the transmit beam steering device directs the output signal out of the lidar system after collimation of the output signal from the transmit coupler by the transmit lens.

7. The lidar system according to claim 1, further comprising a receive lens and a receive beam steering device, wherein the receive lens focuses the received signal directed by the receive beam steering device to the receive coupler.

8. The lidar system according to claim 1, wherein the lidar system is in a vehicle.

9. The lidar system according to claim 8, wherein information obtained from the beat signal is used by a vehicle controller to augment or automate operation of the vehicle.

10. A method of configuring a lidar system, the method comprising:

fabricating or attaching a laser diode on a photonic chip to provide a frequency modulated continuous wave (FMCW) signal;

arranging a current source to provide a drive signal to the laser diode;

configuring a controller to control a pre-distortion of the drive signal;

disposing a splitter to split the FMCW signal into an output signal and a local oscillator (LO) signal;

arranging a transmit coupler to transmit the output signal;

arranging a receive coupler to obtain a received signal based on reflection of the output signal by a target;

assembling a combiner to combine the received signal with the LO signal and split a result into a first combined signal and a second combined signal, wherein the result is based on interference between received signal and the LO signal and indicates a beat frequency;

disposing a first photodetector to receive the first combined signal and output a first electrical signal based on interference of the received signal and the LO signal indicated in the first combined signal; and disposing a second photodetector to receive the second combined signal and output a second electrical signal based on the interference of the received signal and the LO signal indicated in the second combined signal, wherein the configuring includes configuring the controller to obtain a beat signal indicating the beat frequency from the first electrical signal and the second electrical signal and, based on the beat signal, to control the pre-distortion of the drive signal from the current source to obtain the FMCW signal as linear.

11. The method according to claim 10, wherein the determining the pre-distortion of the drive signal includes determining a modulation voltage $V_{app}$ of the drive signal.

12. The method according to claim 11, wherein the determining the modulation voltage $V_{app}$ of the drive signal includes using the beat signal for feedback control, and the determining the modulation voltage $V_{app}$ of the drive signal includes determining the modulation voltage $V_{app}$ that results in a constant frequency of the beat signal.

13. The method according to claim 10, further comprising arranging a transmit beam steering device to direct the output signal out of the lidar system after collimation of the output signal from the transmit coupler by a transmit lens.

14. The method according to claim 10, further comprising arranging a receive lens to focus the received signal directed by a receive beam steering device to the receive coupler.

15. A vehicle, comprising:
a lidar system comprising:
a laser diode configured to provide a frequency modulated continuous wave (FMCW) signal;

a current source configured to provide a drive signal that modulates the laser diode to provide the FMCW signal;

a controller configured to control the current source is controlled to perform pre-distortion of the drive signal;

a splitter configured to split the FMCW signal into an output signal and a local oscillator (LO) signal;

a transmit coupler configured to transmit the output signal;

a receive coupler configured to obtain a received signal based on reflection of the output signal by a target;

a combiner configured to combine the received signal with the LO signal and split a result into a first combined signal and a second combined signal, wherein the result is based on interference between received signal and the LO signal and indicates a beat frequency;

a first photodetector configured to receive the first combined signal and output a first electrical signal based on interference of the received signal and the LO signal indicated in the first combined signal; and a second photodetector configured to receive the second combined signal and output a second electrical signal based on interference of the received signal and the LO signal indicated in the second combined signal, wherein the controller obtains a beat signal indicating the beat frequency from the first electrical signal and the second electrical signal and, based on the beat signal, controls the pre-distortion of the drive signal from the current source to obtain the FMCW signal as linear; and a vehicle controller configured to augment or automate operation of the vehicle based on information obtained from the beat signal.

16. The vehicle according to claim 15, wherein the pre-distortion of the drive signal results from determination of a modulation voltage $V_{app}$ of the drive signal.

17. The vehicle according to claim 16, wherein the modulation voltage $V_{app}$ is determined based on using the beat signal for feedback control.

18. The vehicle according to claim 17, wherein the modulation voltage $V_{app}$ that results in a constant frequency of the beat signal is determined to obtain the pre-distortion of the drive signal.

19. The vehicle according to claim 15, wherein the laser diode is a photon-emitting semiconductor device fabricated on or attached on top of a photonic chip.

20. The vehicle according to claim 15, further comprising a transmit lens, a transmit beam steering device, a receive lens, and a receive beam steering device, wherein the transmit beam steering device directs the output signal out of the lidar system after collimation of the output signal from the transmit coupler by the transmit lens, and the receive lens focuses the received signal directed by the receive beam steering device to the receive coupler.

* * * * *